United States Patent [19]

Ariizumi et al.

[11] Patent Number: 4,541,006
[45] Date of Patent: Sep. 10, 1985

[54] STATIC MEMORY HAVING LOAD POLYSILICON RESISTORS FORMED OVER DRIVER FET DRAINS

[75] Inventors: Shoji Ariizumi, Tokyo; Makoto Segawa, Yokohama, both of Japan

[73] Assignee: Tokyo Shibaura Denki Kabushiki Kaisha, Japan

[21] Appl. No.: 571,948

[22] Filed: Jan. 19, 1984

Related U.S. Application Data

[63] Continuation of Ser. No. 187,794, Sep. 16, 1980, Pat. No. 4,453,175.

[30] Foreign Application Priority Data

Sep. 19, 1979 [JP] Japan .................. 54-119234

[51] Int. Cl.³ .................. H01L 27/04; G11C 11/40
[52] U.S. Cl. .................. 357/41; 357/23.7; 357/23.9; 357/51; 357/59; 365/154; 365/182
[58] Field of Search .................. 357/23.9, 41, 51, 59, 357/23.7, 45; 365/182, 154

[56] References Cited

U.S. PATENT DOCUMENTS

| | | | |
|---|---|---|---|
| 4,110,776 | 8/1978 | Rao et al. | 357/51 |
| 4,125,854 | 11/1978 | McKenny et al. | 357/59 |
| 4,240,097 | 12/1980 | Raymond, Jr. | 357/71 |
| 4,322,824 | 3/1982 | Allan | 357/59 |
| 4,326,213 | 4/1982 | Shirai et al. | 357/59 |
| 4,352,997 | 10/1982 | Raymond, Jr. et al. | 357/23 TF |
| 4,453,175 | 6/1984 | Ariizumi et al. | 357/23.9 |

FOREIGN PATENT DOCUMENTS 52-18114  5/1977  Japan .

OTHER PUBLICATIONS

"A 2K×8-Bit Static RAM", T. Ohzone et al., IEEE IEDM, Tech. Digest, pp. 360-363 (Dec. 3, 1978).

Primary Examiner—William D. Larkins
Attorney, Agent, or Firm—Finnegan, Henderson, Farabow, Garrett & Dunner

[57] ABSTRACT

A semiconductor device having a semiconductor substrate, wherein first and second insulating gate FET transistor connected respectively in series with first and second polycrystalline silicon layers acting as loads of first and second inverters are formed. The first polycrystalline silicon layer is provided above the drain of the first insulation gate FET transistor, and the second polycrystalline silicon layer is provided above the drain of the second insulation gate FET transistor.

3 Claims, 24 Drawing Figures

F I G. 1
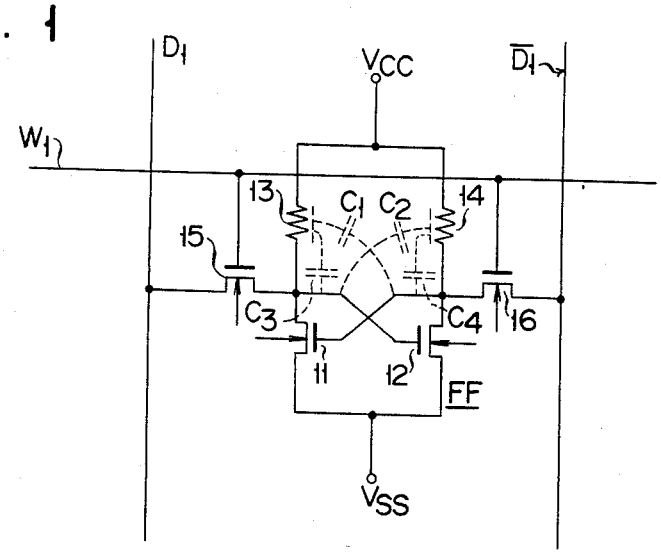
F I G. 2
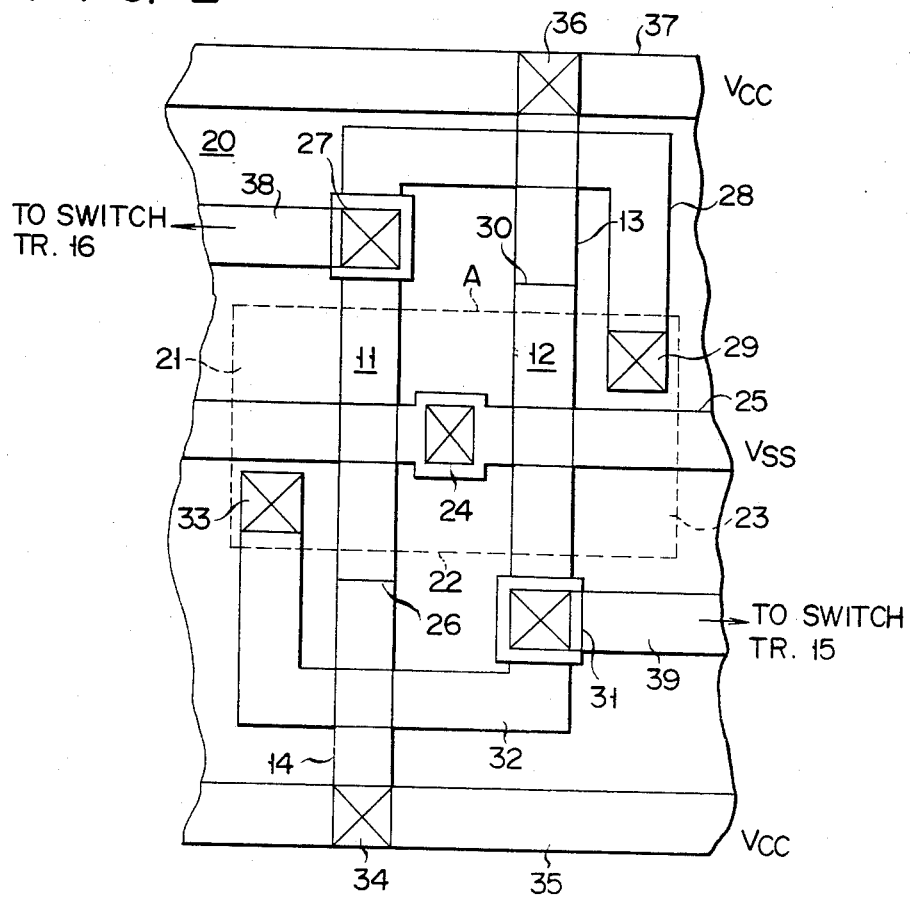

F I G. 3
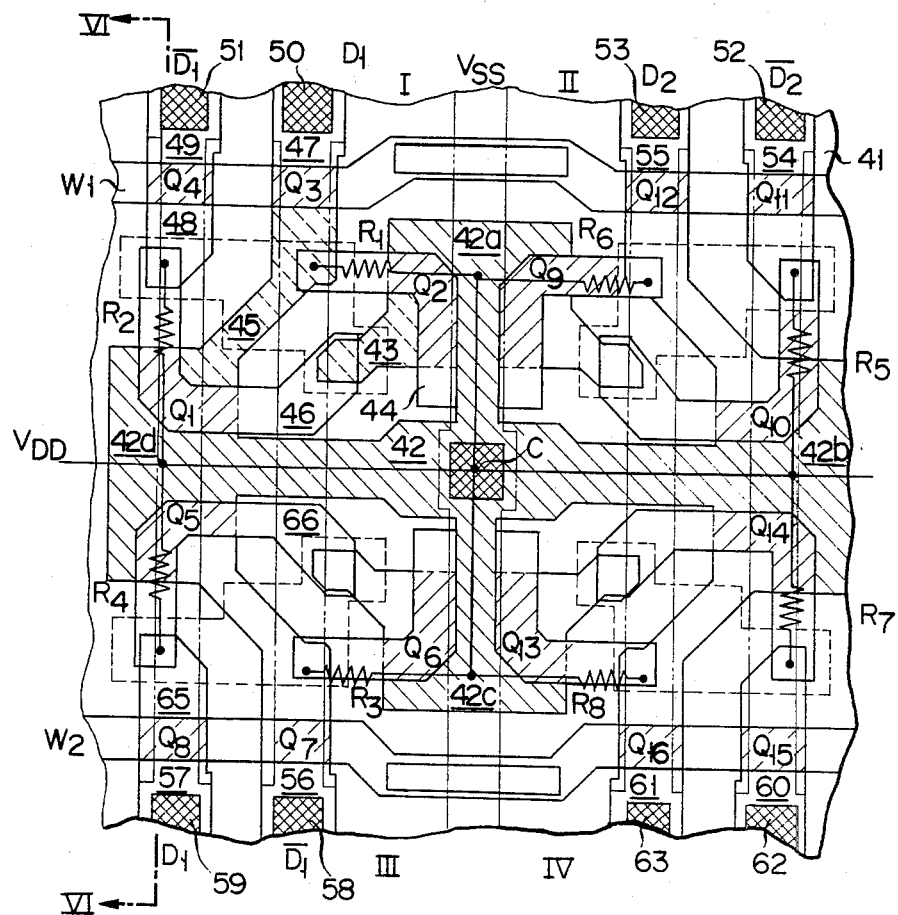

F I G. 4
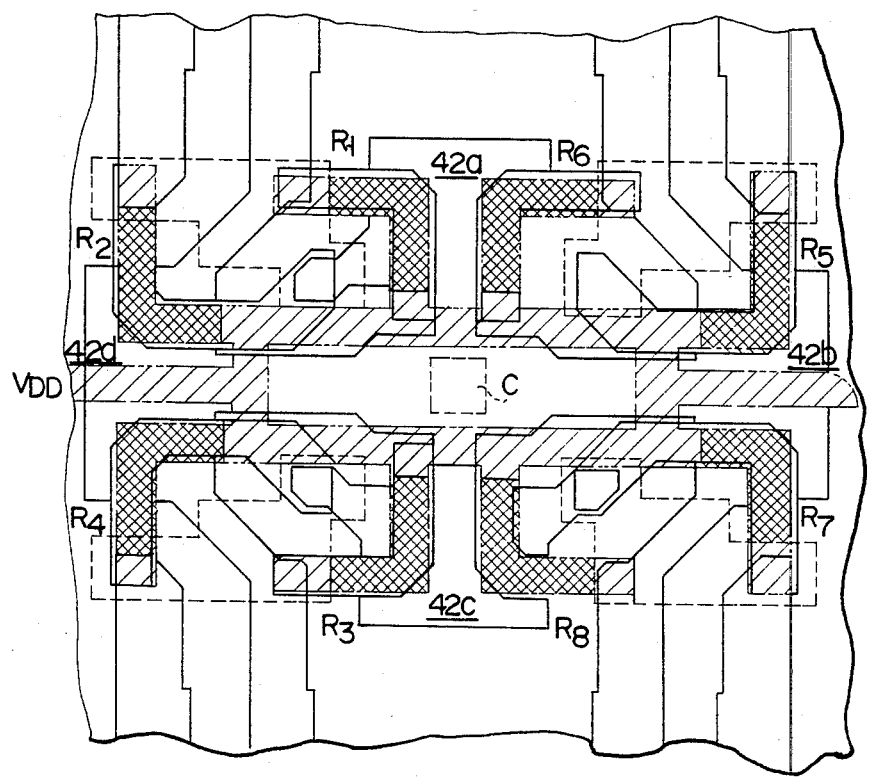

F I G. 8
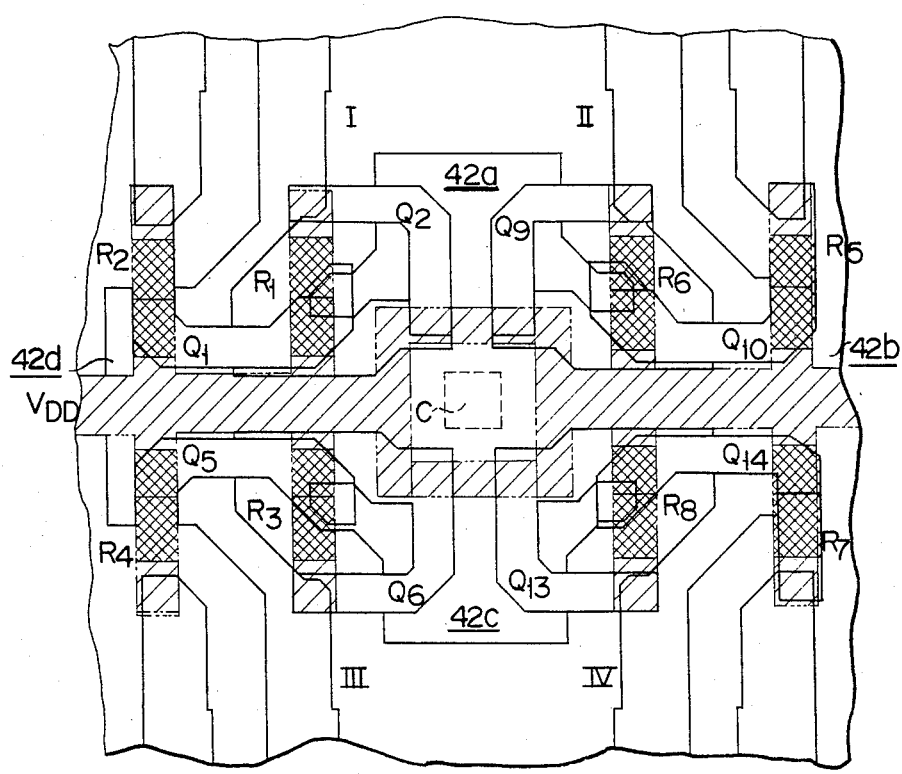

F I G. 9
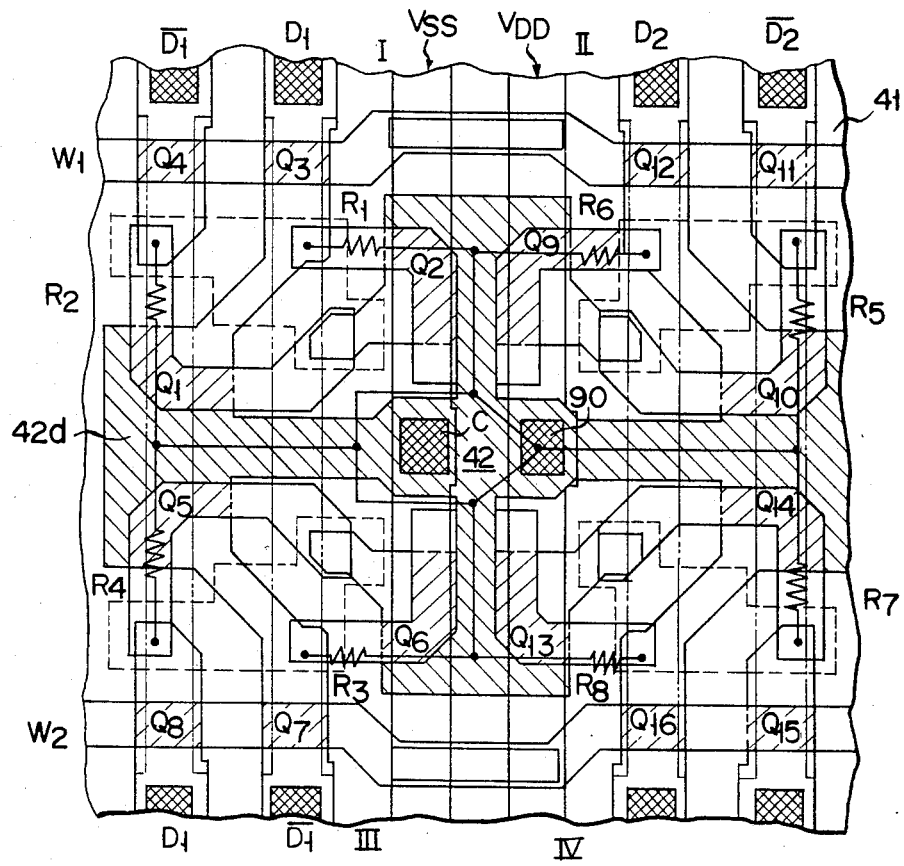

F I G. 10
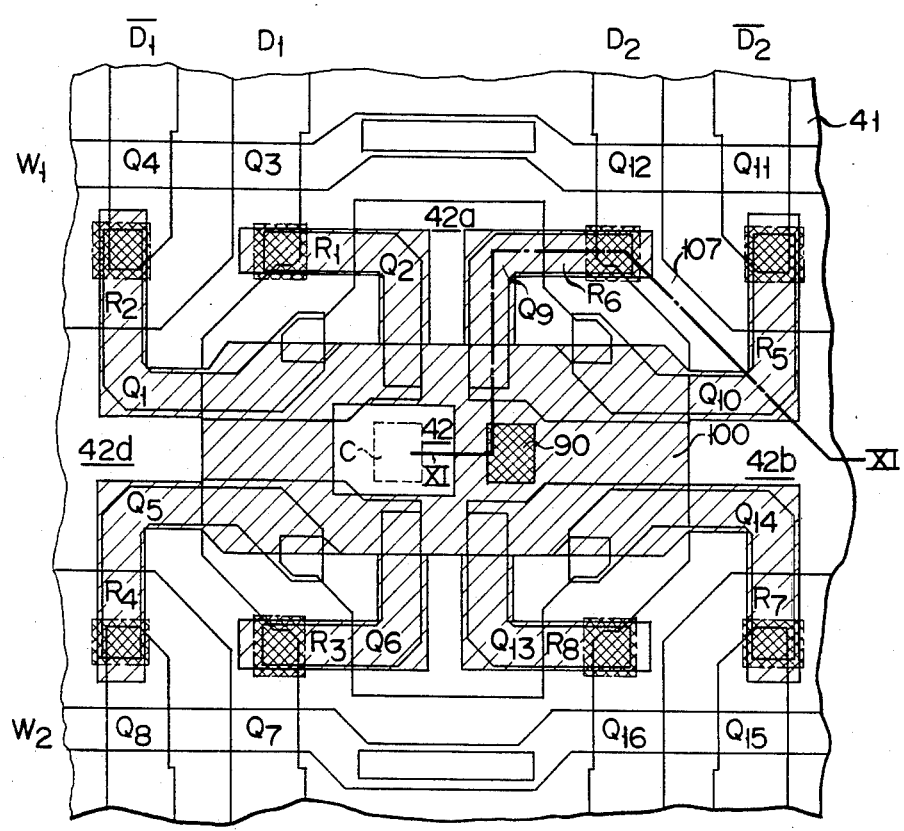

F I G. 14A
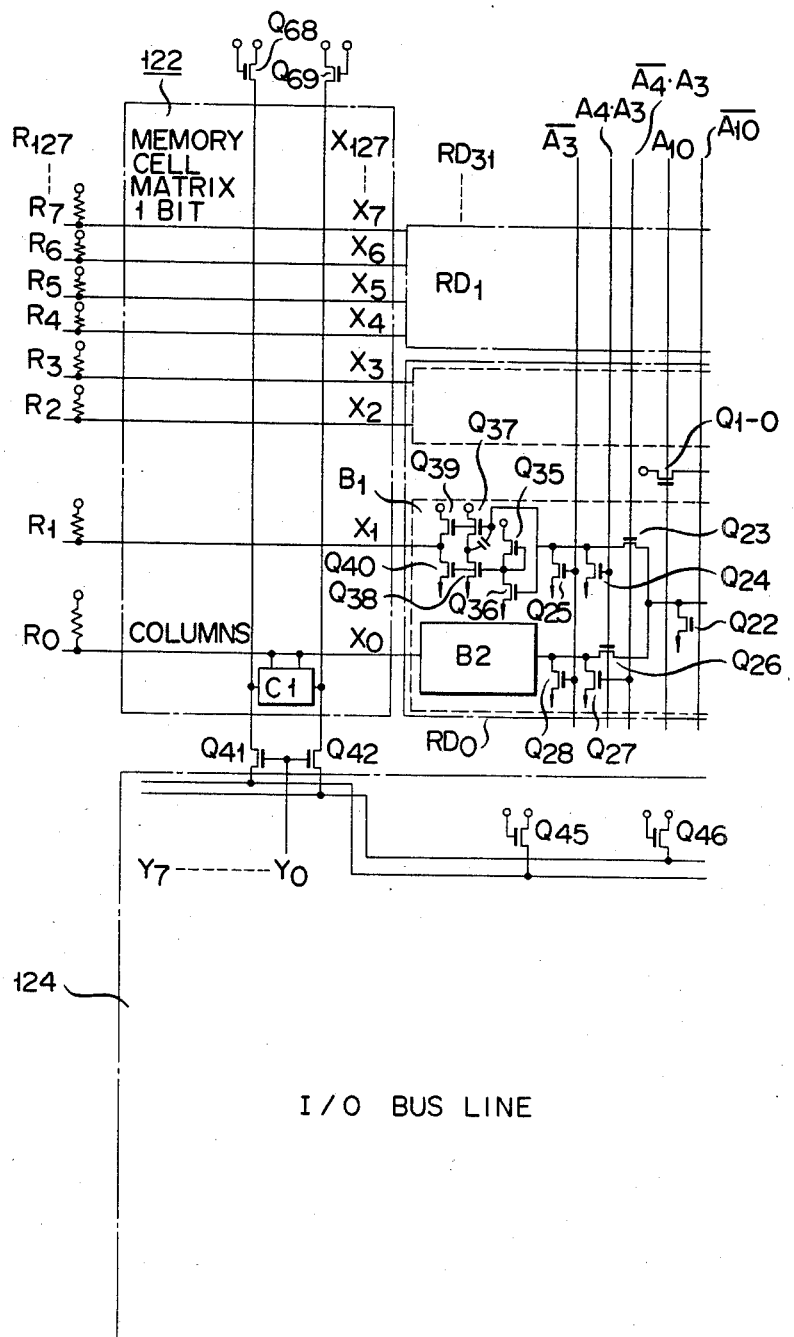

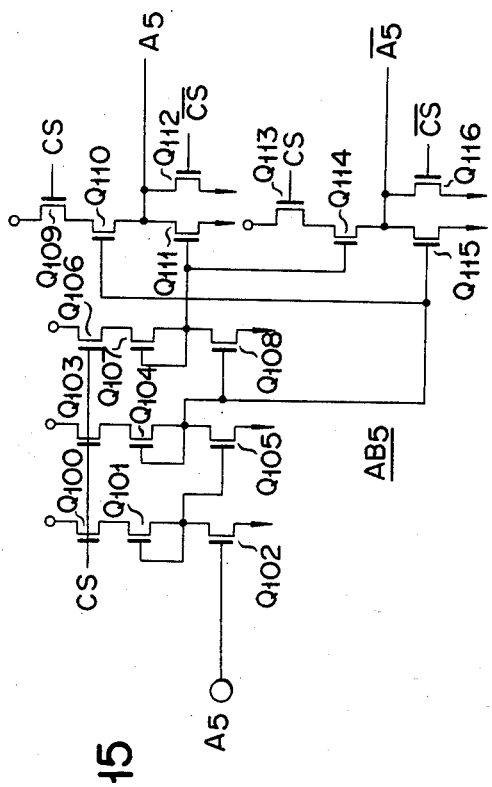
F I G. 15
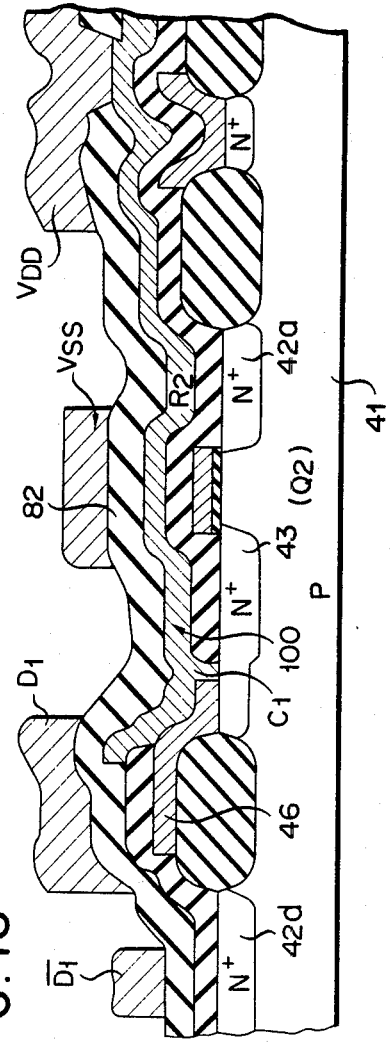
F I G. 18

STATIC MEMORY HAVING LOAD POLYSILICON RESISTORS FORMED OVER DRIVER FET DRAINS

This is a continuation, of application Ser. No. 187,794, filed Sept. 16, 1980 now U.S. Pat. No. 4,453,175.

BACKGROUND OF THE INVENTION

I. Field of the Invention

The present invention relates to a semiconductor device which has a structure suitable for arranging memory cells with high density which can be used in a semiconductor memory device such as a static random access memory (S-RAM).

II. Description of the Prior Art

The need for higher packing density and lower power consumption is becoming more and more imperative in semiconductor memory devices. In order to achieve this purpose, it has been proposed to form a high specific resistance polycrystalline silicon layer through an insulation layer overlying a transistor used as a driver, i.e. a driver transistor as a load resistor of an inverter comprising an insulating gate type driver transistor. By forming a polycrystalline silicon layer as a load resistance overlying a driver transistor, another driver transistor may, for example, be formed on that part of the surface of the semiconductor chip which is usually occupied by the polycrystalline silicon layer, so that the area of an individual memory cell may be reduced and memory cells may be formed with higher density on the semiconductor chip.

However, with this construction, a parasitic capacitance is generated between the gate electrode of the driver transistor and the polycrystalline silicon load resistor so that there is a time lag in the switching speed of the inverter. When an S-RAM is manufactured with the above-proposed structure, it becomes extremely difficult to balance the parasitic capacitance generated between the gate electrode of one of the driver transistors of a flip-flop functioning as a memory cell and the polycrystalline silicon layer as a load of the one of the driver transistors, and the parasitic capacitance generated between the gate electrode of the other transistor and the polycrystalline silicon layer as a load. For balancing the capacitance, the alignment of a mask must be made with high precision during the manufacturing procedure, resulting in degradation of yield and high manufacturing cost.

It is, therefore, the primary object of the present invention to provide a semiconductor device which may be packed with high density, which has a lower power consumption and which may enable operation at high speed.

SUMMARY OF THE INVENTION

To achieve the above and other ends, the present invention provides a semiconductor device having a semiconductor substrate; at least one insulation gate FET transistor comprising a source region and a drain region formed in the semiconductor substrate, and a gate electrode formed on a gate insulation film overlying a channel formed between the source and drain regions; and a first current path including the channel of the insulation gate FET transistor and a conductive path connected to the channel and formed to overly the semiconductor substrate, characterized in that a second current path including at least one polycrystalline silicon layer for a load formed through the insulation film on the insulation gate FET transistor is provided, and that the first current path is so provided as to be isolated from the second current path.

BRIEF DESCRIPTION OF THE DRAWINGS

This invention can be more fully understood from the following detailed description when taken in conjunction with the accompanying drawings, in which:

FIG. 1 is a circuit diagram showing one of the memory cells constituting an S-RAM;

FIG. 2 is a plan view of an embodiment of the memory cell of the present invention;

FIG. 3 is a partial plan view of an S-RAM according to another embodiment of the present invention;

FIG. 4 is a view of an example of a polycrystalline silicon layer used in combination with the S-RAM shown in FIG. 3;

FIGS. 7 and 8 are views of another example of the polycrystalline silicon layer used in combination with the memory cell of FIG. 3;

FIG. 9 is a partial plan view of an S-RAM in accordance with still another embodiment of the present invention;

FIG. 10 is a view of a pattern of the polycrystalline silicon layer used in combination with the memory cell of FIG. 9;

FIGS. 14A and 14B are partial circuit diagrams of FIG. 13;

FIGS. 15 and 16 are circuit diagrams of an address buffer of FIG. 13;

FIG. 18 is a sectional view along the line XVIII—XVIII of FIG. 17.

DESCRIPTION OF THE PREFERRED EMBODIMENT

Figure 5:
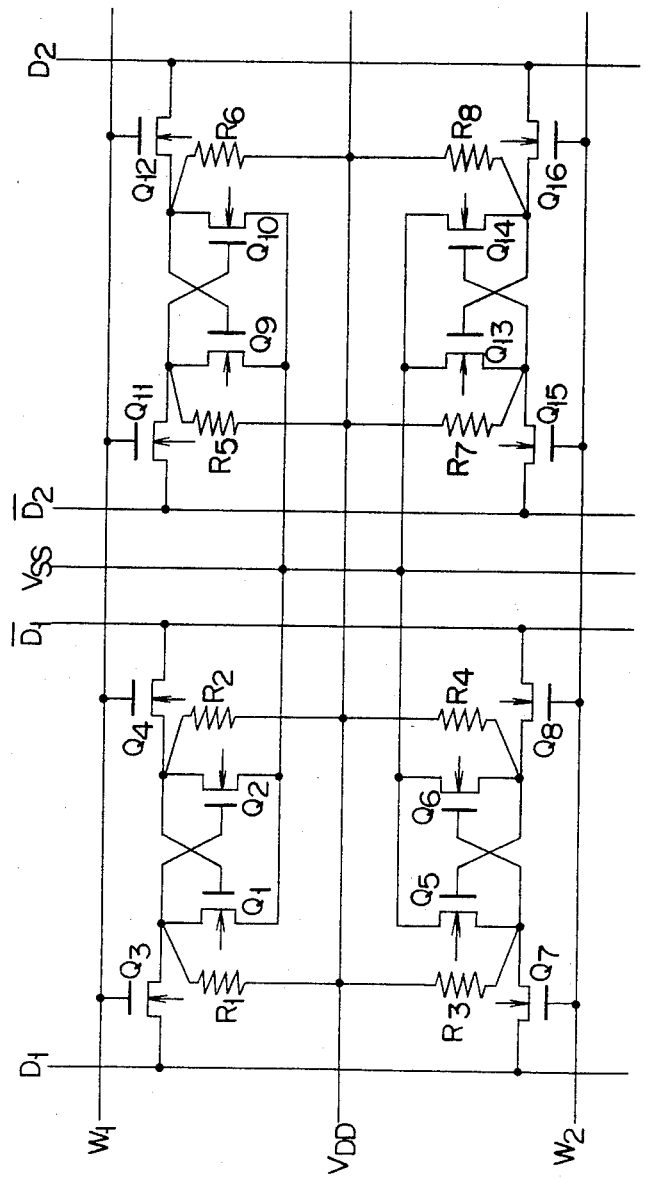
FIG. 5 is a circuit diagram of a part corresponding to four bits of the memory cell of the S-RAM.

FIG. 1 is a circuit diagram of one of the memory cells constituting an S-RAM wherein the sources of a pair of insulation gate FET transistors 11, 12 are commonly connected to one power source $V_{SS}$ terminal, and their drains are connected to another power source $V_{CC}$ terminal through load resistors 13, 14, respectively. The gate electrode of the driver transistor 11 is connected to the junction of the drain of the driver transistor 12 and the load resistor 14, and the gate electrode of the driver transistor 12 is connected to the juncture between the drain of the transistor 11 and the resistor 13. The driver transistor 11, 12 and the load resistors constitute a flip-flop FF which functions as a memory cell. The juncture between the transistor 11 and the resistor 13 is connected to a data line D1 through the source and the drain of a switching transistor 15. The juncture between the transistor 12 and the resistor 14 is connected to a data line $\overline{D1}$ through the source and the drain of another switching transistor 16. The gate electrodes of the switching transistors 15, 16 are respectively connected to a word line W1.

Each individual memory cell constituting the S-RAM is of the above-mentioned construction, and one embodiment of such a memory cell in accordance with the present invention will be described referring to FIG. 2. In FIG. 2, the same parts are designated by the same reference numerals as in FIG. 1. In FIG. 2, the part surrounded by dotted lines is an active area A which includes the source and drain regions of the driver transistors 11 12 of the flip-flop FF and which is formed on the major surface of a semiconductor substrate 20. The active area A comprises a drain region 21 and a common source region 22 of the driver transistor 11; and a drain region 23 and the common source region 22 which constitutes the driver transistor 12. The common source region 22 is connected to a power source line 25 corresponding to the power source terminal $V_{SS}$ through a source contact 24. A gate electrode 26 consisting of a polycrystalline silicon layer is formed between the drain region 21 and the source region 22 through a gate insulation film (not shown), and one end of the polycrystalline silicon gate electrode 26 of the driver transistor 11 is connected to a gate contact 27. Another polycrystalline conductive body 28 further extends from the gate contact 27, and its front end is connected to a drain contact 29 formed in the drain region 23 of the driver transistor 12.

A gate electrode 30 consisting of a polycrystalline silicon layer is formed between the source region 22 and the drain region 23 of the driver transistor 2 through an insulation film (not shown), and one end of the polycrystalline silicon gate electrode 30 is connected to a gate contact 31. A polycrystalline silicon conductive body 32 further extends from the gate contact 31, and its front end is connected to the drain region 21 of the driver transistor 11 through a drain-contact 33. High specific resistance polycrystalline-silicon layer loads 14, 13 are formed through an insulation film (not shown) on the gate electrodes 26, 30 of the driver transistors 11, 12, respectively, from the gate contacts 27, 31. The high specific resistance polycrystalline silicon layer loads 14, 13 are connected to a contact 34 formed in a first $V_{CC}$ power source line 35 and to a contact 36 formed in a second $V_{CC}$ power source line 37. The widths of the high specific resistance polycrystalline silicon layer loads 14, 13 are defined to be substantially the same as those of the gate electrodes 26, 30, respectively.

Other polycrystalline silicon conductive layers 38, 39 extend from the gate contacts 27, 31 and are connected to the source or drain region of the switching transistors 16, 15 shown in FIG. 1. Although two data lines D1, D1 and one word line W1 are shown in FIG. 1, these are omitted in FIG. 2.

In the embodiment shown in FIG. 2, the load resistor 13 of the driver transistor 11 is not formed on the gate electrode 26 of the transistor 11, but overlying the gate electrode 30 of the other transistor 12. Similarly, the load resistor 14 of the transistor 12 is formed above the gate electrode 26. Thus, the parasitic capacitance $C_1$ shown in FIG. 1 and formed between the gate electrode 26 of the transistor 11 and the load resistor 13 connected in series with the transistor 11, and the parasitic capacitance $C_2$ shown in FIG. 1 and formed between the gate electrode 30 and the load resistor 14, do not adversely affect the operating balance of the flip-flop consisting of these transistors 11, 12. Further, since the load resistors 14, 13 are formed above the gate electrodes 26, 30 of the transistors 11, 12, the area of the memory cell is not increased by the load resistors 14, 13. The source region 22 is commonly used for the two transistors 11, 12, and the source contact may be commonly used for the two transistors 11, 12, so that the memory cell may be formed in a compact manner.

Another embodiment of the present invention will be described referring to FIG. 3. In the drawing, an $n^+$-type diffused region 42 of one conductivity type is formed on the major surface of a p-type silicon substrate 41 of the opposite conductivity type. The region 42 is shown by the hatch marks from the upper left portion to the lower right portion of the figure and has, around a contact C formed at its center first, second, third and fourth extensions 42a, 42b, 42c and 42d extending from the contact C in the directions of the row and column. The part of the major surface of the semiconductor substrate 41 surrounded by the first through fourth extensions 42a–42d is divided into first through fourth memory cell forming regions I through IV around the contact C. A memory cell forming region I is formed between the extensions 42a and 42d and the memory cells forming regions II–IV are formed between 42a and 42b, between 42c and 42d, and between 42b and 42c, respectively. The memory cells formed inside the memory cell forming regions I–IV are of the same construction and the description to follow will thus be made only about the memory cell forming region I.

The front end of the extension 42a is formed in a T-shape extending in the direction of the row, and an $n^+$-type region 43 is formed in the region I along the side end of the extension 42a. A polycrystalline silicon gate electrode 44 of L-shape is formed through a gate insulation film between one end of the region 43 and the extension 42a so as to form the driver transistor Q2 (hatched portion from the upper right to the lower left). The other end of the region 43 is extended toward the extension 42d. The region 43 is indicated as hatched by broken lines from the upper left to the lower right.

The front end of the extension 42d is formed in a T-shape extending in the direction of the column and another $n^+$-type region 45 is formed covering the T-shape extension and the sides. An L-shaped polycrystalline silicon gate electrode 46 is formed through an insulation film between the extension 42d and the one end of the $n^+$-type region 45 which is closer to the extension 42d, so as to form a driver transistor Q1 (hatched from the upper right to the lower left). One end of the gate electrode 46 overlaps the extended part of the $n^+$-type region 43 and the other end thereof extends outward, in the figure (in the direction of the column). The other end of the $n^+$-type region 45 is diagonally upwardly extended, and one end of the gate electrode 44 overlaps part of the region 45. The $n^+$-type region 45 is the part shown by the broken hatch marks, extending from the upper left to the lower right. Its other end is arranged to form a switching transistor Q3 between itself and another $n^+$-type region 47 spaced a predetermined distance. A pair of $n^+$-type regions 48, 49 are formed so that a second switching transistor Q4 is aligned with the switching transistor Q3 consisting of the $n^+$-type regions 45, 47. The extended part at the other end of the polycrystalline silicon gate electrode 46 overlaps the one end of the $n^+$-type region 48. The word line W1 used commonly as the gate electrode of the switching transistors Q3, Q4 consists of a polycrystalline silicon layer and is arranged in the direction of the row of Q3, Q4 in a manner as in the region II.

Data line contacts 50, 51 are formed in the n+-type regions 47, 49 and through these data line contacts 50, 51 are formed the two data lines D1, $\overline{D1}$ arranged parallel in the direction of the column and spaced apart by a predetermined distance. A power source (grounding) line $V_{SS}$ is formed in the direction of the column passing through the central contact C and is connected to the n+-type region 42 at the contact C.

A pair of driver transistors and a pair of switching transistors are formed in each of the remaining memory cell forming regions II–IV in the same manner as in the region I. A pair of driver transistors Q9, Q10 and a pair of switching transistors Q11, Q12 are formed in the region II. The gate electrode of the switching transistors Q11, Q12 is connected to the word line W1 commonly with the switching transistors Q3, Q4 in the region I. Data line contacts 52, 53 are respectively formed in $n^{30}$-type regions 54, 55 which make up the switching transistors Q11, Q12. Two data lines D2, D2 arranged parallel in the direction of the column are connected to the contacts 52, 53.

A pair of driver transistors Q5, Q6 and a pair of switching transistors Q7, Q8 are formed in the region III. The gate electrodes of the switching transistors Q7, Q8 are commonly connected by the word line W2 arranged in the direction of the row. Data line contacts 58, 59 are formed in n+-type regions 56, 57 which make up the switching transistors Q7, Q8, and the data lines $\overline{D1}$, D1 are connected to the contacts 58, 59.

A pair of driver transistors Q13, Q14 and a pair of switching transistors Q15, Q16 are formed in the region IV. Data line contacts 62, 63 are formed respectively in n+-type regions 60, 61 which make up the switching transistors Q15, Q16 and the data lines $\overline{D2}$, D2 are respectively connected to the contacts 62, 63.

After a pair of driver transistors and a pair of switching transistors are formed in each of the memory cell forming regions I–IV, the entirety of the chip is covered with an insulation film such as a silicon oxide film. Over this insulation film is formed a wiring pattern including the power source line $V_{DD}$. Although this wiring pattern is shown by the line diagram in FIG. 3 for illustrating the connection between the pattern and the other parts, a polycrystalline silicon layer of a pattern as shown in FIG. 4 may be used in practice.

Referring to FIG. 4, the hatched part indicates a low specific resistance polycrystalline silicon layer of high concentration impurity mainly used as the power source line $V_{DD}$, and the crosshatched part is a high specific resistance polycrystalline silicon layer of a low concentration impurity connected as load resistors R1, R2, R3, R4, R5, R6, R7, and R8 to the driver transistors Q1, Q2, Q5, Q6, Q9, Q10, Q13, and Q14 shown in FIG. 3. As may be apparent from FIGS. 3 and 4, one end of each of the load resistors R1, R2 is commonly connected to the power source line $V_{DD}$, and the other end is connected commonly with the gate electrodes 44, 46 to one of the n+-type regions 45, 48 which make up the switching transistors Q3 and Q4, respectively. The ends of the remaining load resistors R3–R8 are commonly connected to the power source line $V_{DD}$; the other ends of the load resistors are connected with the gate electrodes of the driver transistors Q6, Q5, Q10, Q9, Q14, and Q13, or with one of the associated n+-type regions which make up the switching transistors Q7, Q8, Q11, Q12, Q15 and Q16.

The pattern of the high specific resistance polycrystalline silicon layer used as the load resistors R1–R8 in FIG. 4 is such that it substantially overlaps the gate electrodes of the driver transistors Q2, Q1, Q6, Q5, Q10, Q9, Q14, and Q13.

FIG. 5 is a circuit diagram of four memory cells formed by superposing the polycrystalline silicon layer of FIG. 4 on the device of FIG. 3. As shown in this figure, load resistors R1–R8 are respectively connected in series between the power source lines $V_{DD}$ and $V_{SS}$ to the respective driver transistors Q1, Q2, Q5, Q6, Q9, Q10, Q13 and Q14 for forming two current paths for each memory cell. As may be apparent from FIG. 4, in each memory cell, a load resistor in a different current path from the transistor is arranged at the upper part of each transistor: the load resistor R2 is arranged for the transistor Q1; the resistor R1 for the transistor Q2, the resistor R4 for the transistor Q5; the resistor R3 for the transistor Q6; the resistor R6 for the transistor Q9; the resistor R5 for the transistor Q10; the resistor R8 for the transistor Q13; and the resistor R7 for the transistor Q14. With this arrangement, the parasitic capacitances C1, C2 as shown in FIG. 1 are eliminated, and the capacitances generated in the current paths themselves, i.e. C3, C4, are generated. Since the operation balance of the flip-flop FF is not affected by the capacitance of its own wiring, the balance is not broken so that the normal see-saw operation may be performed. The polycrystalline silicon layer pattern shown in FIG. 4 may be easily obtained by forming the entire layer with high specific resistance polycrystalline silicon, and injecting an impurity at a high concentration for conductiveness at any selected part of the layer for forming the low specific resistance part such as the power source line $V_{DD}$.

In FIG. 3, the data lines D1, $\overline{D1}$, D2, $\overline{D2}$, and the ground lines $V_{SS}$ are formed after forming the transistors Q1–Q16 and the load resistors R1–R8. The word lines W1, W2 and the power source line $V_{DD}$ can be formed during the formation process of the polycrystalline silicon layer for the gate electrodes of the respective driver transistors, or during the formation process of the other polycrystalline silicon layer for the load resistors so that the number of processes is not increased.

The data lines D1, $\overline{D1}$, D2, and $\overline{D2}$, and the ground line $V_{SS}$ may be formed by, for example, aluminum vapor deposition in a single process. For effectively arranging the aluminum wiring, the arrangement of the foundation must be effectively performed. In the embodiment of FIGS. 3 and 4, for using one ground line $V_{SS}$ for the four memory cells, the memory cell forming regions I, II, III, and IV are arranged in a square form around the central contact C; the region IV is arranged symmetrically with the region I, and the region III is arranged symmetrically with the region II about the central point. As a result, the respective driver transistors may be arranged back to back, so that the driver transistor Q1 of L-shape and big current capacity is arranged back to back to the driver transistor Q5; Q2 to Q9; Q6 to Q13; and Q10 to Q14. Thus, the sources of the respective driver transistor may be commonly used by one n+-type region 42. Thus, only one contact C is required for the contact of the ground line $V_{SS}$, and the ground line $V_{SS}$ may also be used for four memory cells. It is apparent that this leads to an improvement in yield in the manufacturing process of the aluminum wiring.

FIGS. 3 and 4 each are plan views of the memory device according to the present invention. For better understanding of the structure of the memory device, the structure of the section along the line VI—VI of FIG. 3 will be described, referring to the views of FIGS. 6A–6F illustrating the manufacturing process.

Figure 6A:
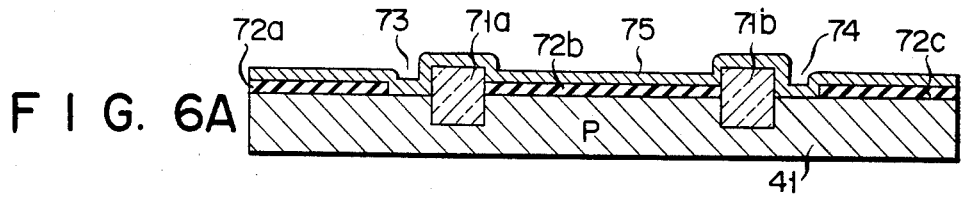
FIGS. 6A–6F are sectional views illustrating the manner of manufacturing procedure for the embodiment of FIG. 3.
Figure 6B:
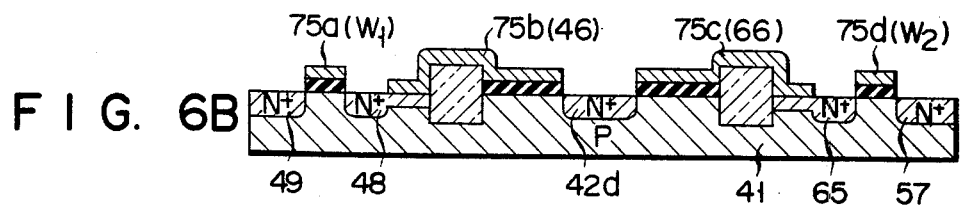

In FIG. 6A, field insulation layers 71a, 71b formed by local oxidation of silicon (LOCOS) are formed on the major surface of the p-type silicon semiconductor substrate 41. Surface areas other than the field insulation layers 71a, 71b are active areas on which thin insulation layers 72a, 72b and 72c are formed. N+-type regions 42d, 48, 49, 57 and 65 are formed in the active areas. Parts 73, 74 (generally referred to as bured contacts) of the polycrystalline silicon layer to be used as gate electrodes 46, 66 to contact the substrate 41 are etched away in the insulation layers 72a, 72b and 72c, and a first polycrystalline silicon layer 75 is formed over the entire surface including these etched parts 73, 74. The first polycrystalline silicon layer 75 undergoes a photoetching procedure, and required portions 75a, 75b, 75c and 75d are left, as shown in FIG. 6B. Using these remaining parts 75a–75d as a mask, the exposed parts of the thin insulation layers 72a, 72b are etched away. Thereafter, an n-type impurity is diffused to a high concentration from the exposed part of the base body to form n+-type regions 49, 48, 42d, 65 and 57. Since an n-type impurity is also diffused in the portions 75a–75d of the first polycrystalline silicone layers to render them conductive these portions are respectively formed as the word line W1, the gate electrode 46, the gate electrode 66, and the word line W2.

Figure 6C:
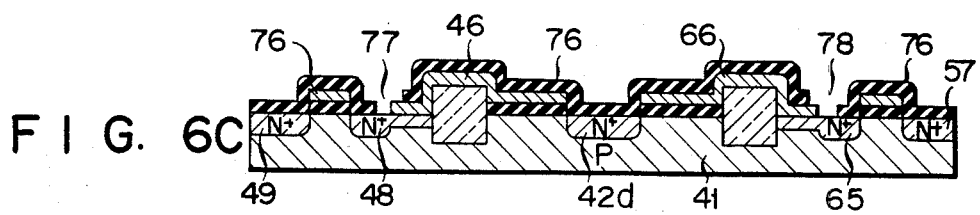
Figure 6D:
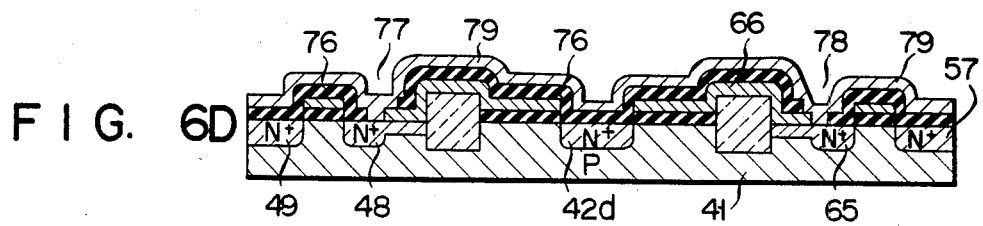

Thereafter, as shown in FIG. 6C, an insulation layer 76 is superposed over the entire surface of the device, and openings 77, 78 are formed as contact parts on the surface of the n+-type regions 48, 65. Thereafter as shown in FIG. 6D, a second polycrystalline silicon layer 79 is formed over the entire surface of the base body including the contact openings 77, 78. This silicon layer 79 is formed to have a predetermined seat resistance, and by dividing it into predetermined areas, a limited portion may be used for a predetermined resistance.

Figure 6E:
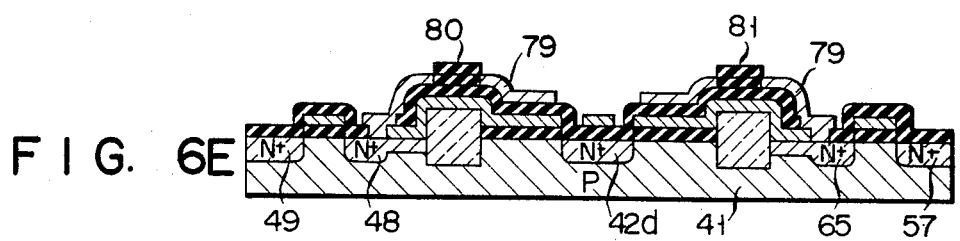
Figure 6F:
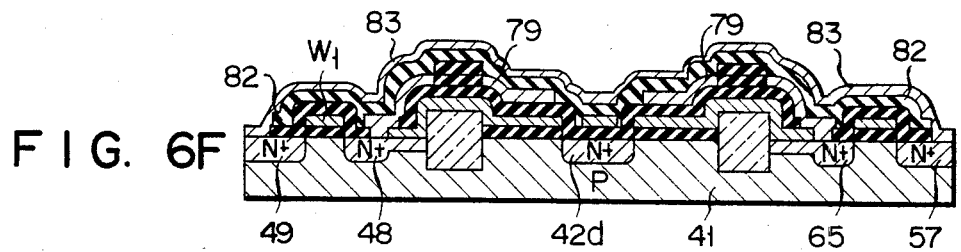

By the photoetching processing, for example, by the dry etching technique, the second polycrystalline silicon layer 79 is patterned, and a silicon layer pattern as shown in FIG. 4 is formed. At this time, to those parts of the second polycrystalline silicon layer 79 contacting with the n+-type regions 48 and 65 are diffused impurities from the regions 48 and 65 to form ohmic contacts therebetween. In this specification, the contact portions thus formed are defined as substantially direct contacts. Throughout the specification, by the term "direct contact" is meant contact of the second polycrystalline silicon layer constituting the high specific resistance layer, constituting the high specific resistance layer having a "substantially uniform low impurity concentration maintained therein", with a high impurity concentration region, for instance source or drain diffusion region, or with a high impurity concentration polycrystalline silicon layer, without any intervening layer. The formed condition is shown in FIG. 6E. Next, insulation blocks 80, 81 are formed at parts corresponding to the resistors R2, R4, and an impurity is diffused in the rest of the polycrystalline silicon layer 79. Next, a second insulation layer 82 is formed, as shown in FIG. 6F, on the device of the structure shown in FIG. 6E, and aluminum wiring 83 to be used as the data line $\overline{D1}$ is formed on the insulation layer 82.

Figure 7:
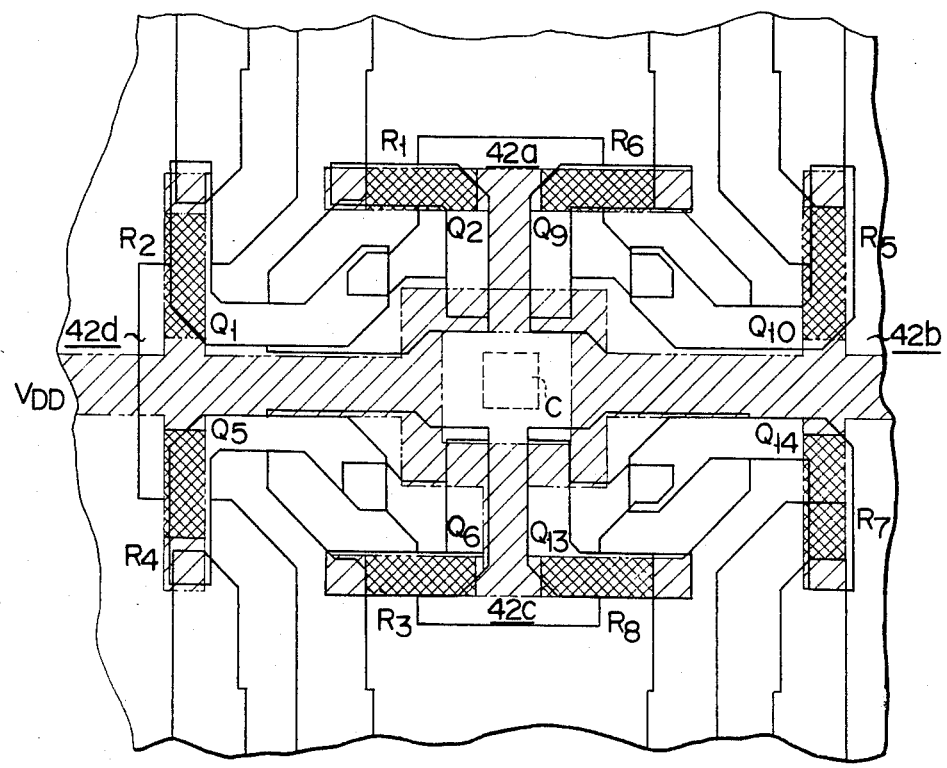

The pattern of the polycrystalline silicon layer for forming the power source line $V_{DD}$ and the resistors R1–R8 of FIG. 4 is not limited to the above-described example; for example, the polycrystalline silicon layer of the pattern shown in FIGS. 7 and 8 may be used. Although the resistor pattern is substantially the same as the L-shaped gate electrode of the driver transistor in FIG. 3, the area by which the resistors R1–R8 overlap the gate electrodes is reduced by about half in the pattern shown in FIG. 7. Consequently, only one extended part of the power source line $V_{DD}$ is required for the extended parts 42a–42d of the n+-type region 42, and the pattern of the resistors R1–R8 further extends from the end of this extended part so that the pattern is made simpler than that shown in FIG. 4.

In the case of FIG. 8, the pattern is such that a load resistor is arranged only above the gate electrode of one of the two driver transistors formed in each of the memory cell forming regions I–IV. In the case of FIG. 8, resistors R2, R4, R5 and R7 are arranged only above the driver transistors Q1, Q5, Q10, and Q14.

FIG. 9 shows a modification of the pattern of the power source line $V_{DD}$ and the ground line $V_{SS}$, while the pattern for the active region for forming the driver transistors and the switching transistors, the pattern of the gate electrodes, the patterns of the word line and the data line are the same as in the embodiment shown in FIG. 3. In FIG. 9, the contact C of the n+-type region 42 as the common source region of the respective driver transistors Q1, Q2, Q5, Q6, Q9, Q10, Q13, and Q14 is formed at a position shifted slightly toward the extended part 42d of the region 42 from the central portion of the memory cell forming regions I–IV. The ground line $V_{SS}$ is formed in the direction of the column, passing the contact C. On the other hand, the power source line $V_{DD}$ is formed substantially parallel to the ground line $V_{SS}$ in the direction of the column and a contact hold 90 of the ground line $V_{SS}$ is formed at a position close to the contact C. The pattern of the power source line $V_{DD}$ and the load resistors R1–R8 connected thereto is formed as shown by the inclined hatched portions in FIG. 10. This pattern is basically the same as that shown in FIG. 4, and the pattern of the resistors R1–R8 overlap with the pattern of the gate electrodes of the respective driver transistors.

Figure 11:
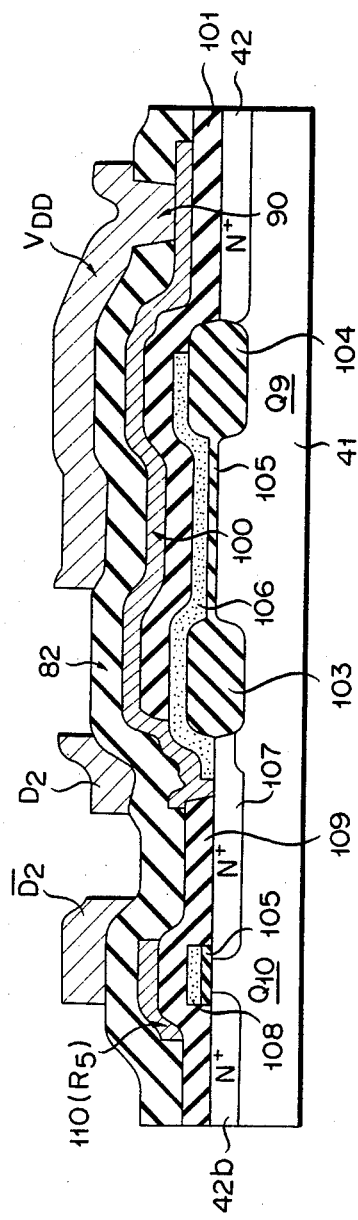
FIG. 11 is a sectional view along the line XI—XI of FIG. 9.

For explaining the internal structure of the device shown in FIGS. 9 and 10, the section along the line XI—XI of FIG. 10 is shown in FIG. 11. In FIG. 11, the corresponding parts are designated by the same reference numerals as in FIG. 3 and FIGS. 6A–6F. In FIG. 11, the power source line $V_{DD}$ formed on the insulation layer 82 is inserted in the contact hold 90 and is connected to a polycrystalline layer 100 formed below the insulation layer 82. An insulation layer 101 is formed below the polycrystalline silicon layer 100. The n+-type source region 42 is formed below part of the insulation layer 101, and field oxide layers 103, 104 and a thin oxide layer 105 are formed below the insulation layer 101. A low resistance polycrystalline silicon layer 106 to become the gate electrode of the driver transistor Q9 is formed between the oxide layers 103–105 and the insulation layer 101. The driver transistor Q10 is formed between n+-type regions 42b, 107 and one end of the polycrystalline silicon layer load 100 is formed in direct contact with the n+-type region 107. One end of the silicon layer 106 is connected to the region 107. A polycrystalline silicon gate electrode 108 is formed on the channel of the transistor Q10 with the thin insulation layer 105 therebetween, and a polycrystalline silicon layer 110 to be used as the resistor R5 is formed on the gate electrode 108 with an insulation layer 109 therebetween. The data lines $\overline{D2}$, D2 are further formed on the insulation layer 82.

An example of the semiconductor device of this structure as applied to an S-RAM will be described below. Although the semiconductor device of the present invention has good power consumption characteristics, the net power consumption may be significantly decreased and the capacity of the memory size may be vastly increased with the structure to be described below.

Figure 12:
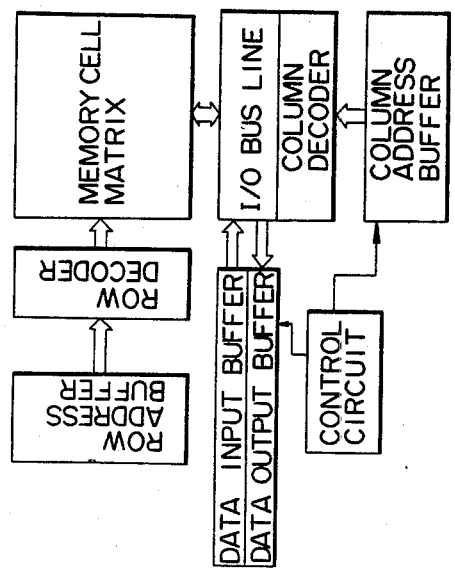
FIG. 12 is a block diagram of a general memory system.

FIG. 12 schematically shows the general structure of an example of a conventional semiconductor memory system, a static random access memory (to be referred to as an S-RAM for brevity hereinafter). The ratio of the power consumption to the total power at each part of the S-RAM is examined, and the results are shown in Table 1 below:

TABLE 1

| Part name | Power consumption ratio (%) |
| --- | --- |
| Row, column address buffers | 28.9 |
| Row, column decoders | 48.9 |
| I/O bus line | 16.1 |
| Data input/output buffers | 4.4 |
| Control circuit | 1.7 |

As seen from Table 1, about 65% of the total power consumption is shared by the column and row (address) decoders and the I/O bus line (including the memory cells). This is due to the fact that the FET transistors for selecting the addresses of all the memory cells connected to the word (row) line selected by the row decoder are turned on in the I/O bus line, and a current flows from the digital line (column line) through the FET driver transistor at the "0" data side of the memory cell.

Considering this, the power consumption of the S-RAM may be considerably reduced by decreasing by half the number of memory cells which are arranged in the direction of the row selected by the word line, while reading out the data and thereby reducing the power consumption at the I/O bus line, the row decoder and the address buffer.

Figure 13:
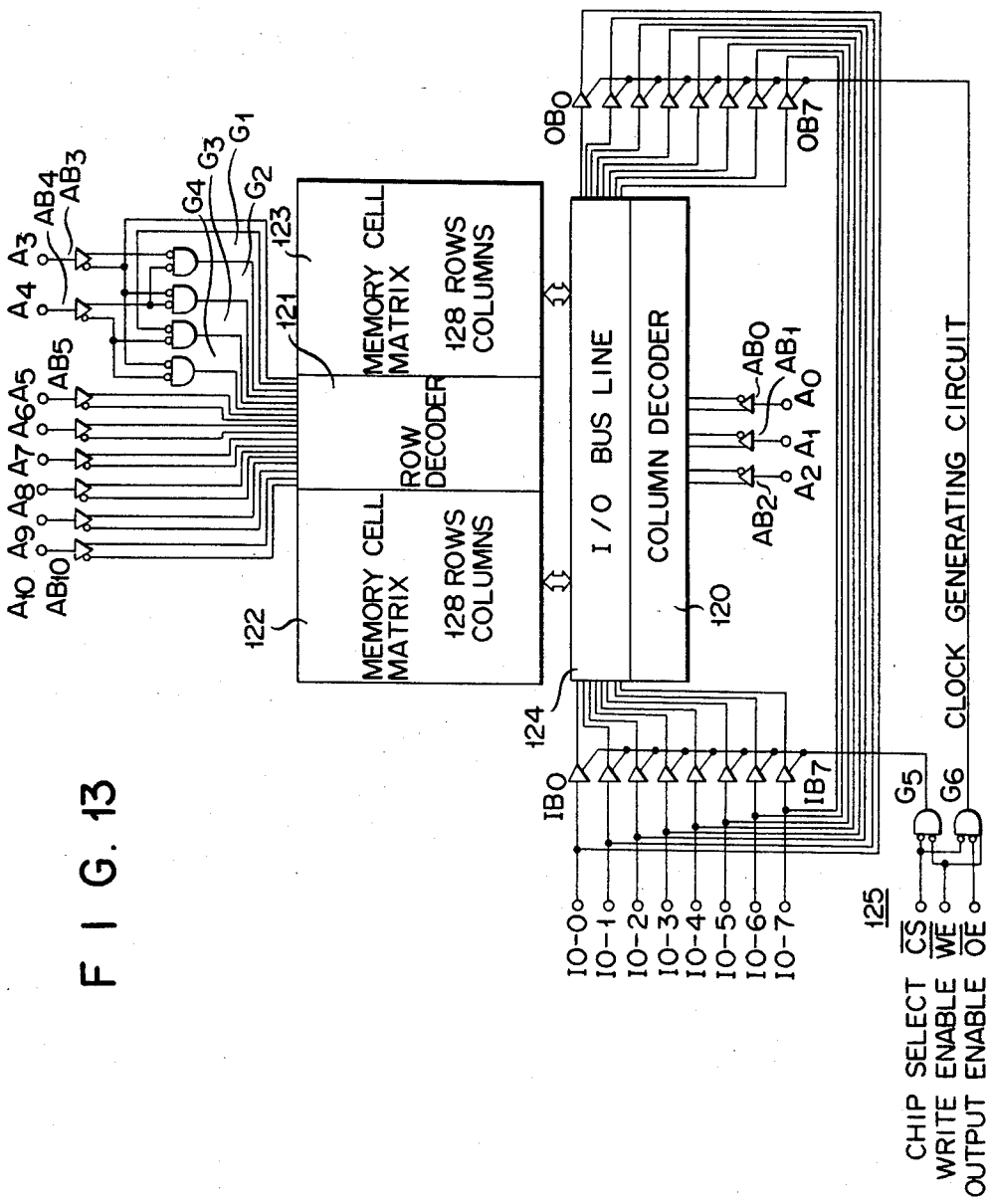
FIG. 13 is a block diagram of the S-RAM.

An S-RAM of 2048 words×8 bits structure will be described below. Referring to FIG. 13, A0-A10 denote address terminals, the address terminals A0-A2 being connected to the input side of a column decoder 120 through address buffers AB0-AB2. The address terminals A3, A4 are connected to the input of the address buffers AB3, AB4, and the outputs of these buffers are connected to the input side of a row decoder 121 through NOR gates G1-G4. The address terminals A5-A10 are connected to the input side of the row decoder 121 through address buffers AB5-AB10.

The output of the row decoder 121 is connected to the row lines (word lines) of a first memory cell matrix 122 and a second memory cell matrix 123. In each of the first and second memory cell matrices 122 and 123, 128 word lines and 64 column lines (digit lines) for 8 words (one word being 8 bits) are arranged in matrix form. The first and second memory cell matrices 122, 123 and the column decoder 120 are coupled to an I/O bus line 124. Writing and reading out of the data in the memory cell matrices 122, 123 are performed through the I/O bus line 124. Transfer of the data from the outside to the I/O bus line 124 is effected through input/output terminals IO-0 through IO-7 to the I/O bus line 124 through input buffers IB0-IB7. Transfer of the data from the I/O bus line 124 to the outside is effected through output buffers OB0-OB7. The input buffers IB0-IB7 and the output buffers OB0-OB7 control the input and output of the data as controlled by a control circuit 125 consisting of NOR gates G5, G6 and control signal input terminals $\overline{CS}$, $\overline{WE}$, and $\overline{OE}$. The input terminal $\overline{CS}$ receives a chip select signal, $\overline{WE}$ receives a write enable signal, and $\overline{OE}$ receives an output enable signal. When, for example, the write enable signal and the chip select signal are applied, the output is supplied from the gate G5 to the input buffers IB0-IB7, and the input data is supplied to the memory cell matrices 122, 123 through the I/O bus line 124. When the output enable signal and the chip select signal are both applied, the data is read out through the output buffers OB0-OB7.

The memory cell matrices, the input/output circuit, the output buffers, and the input buffers shown in FIG. 13 are for 8 bits each. However, since the circuit construction is the same for every bit, the description will be made for only one bit.

Figure 14B:
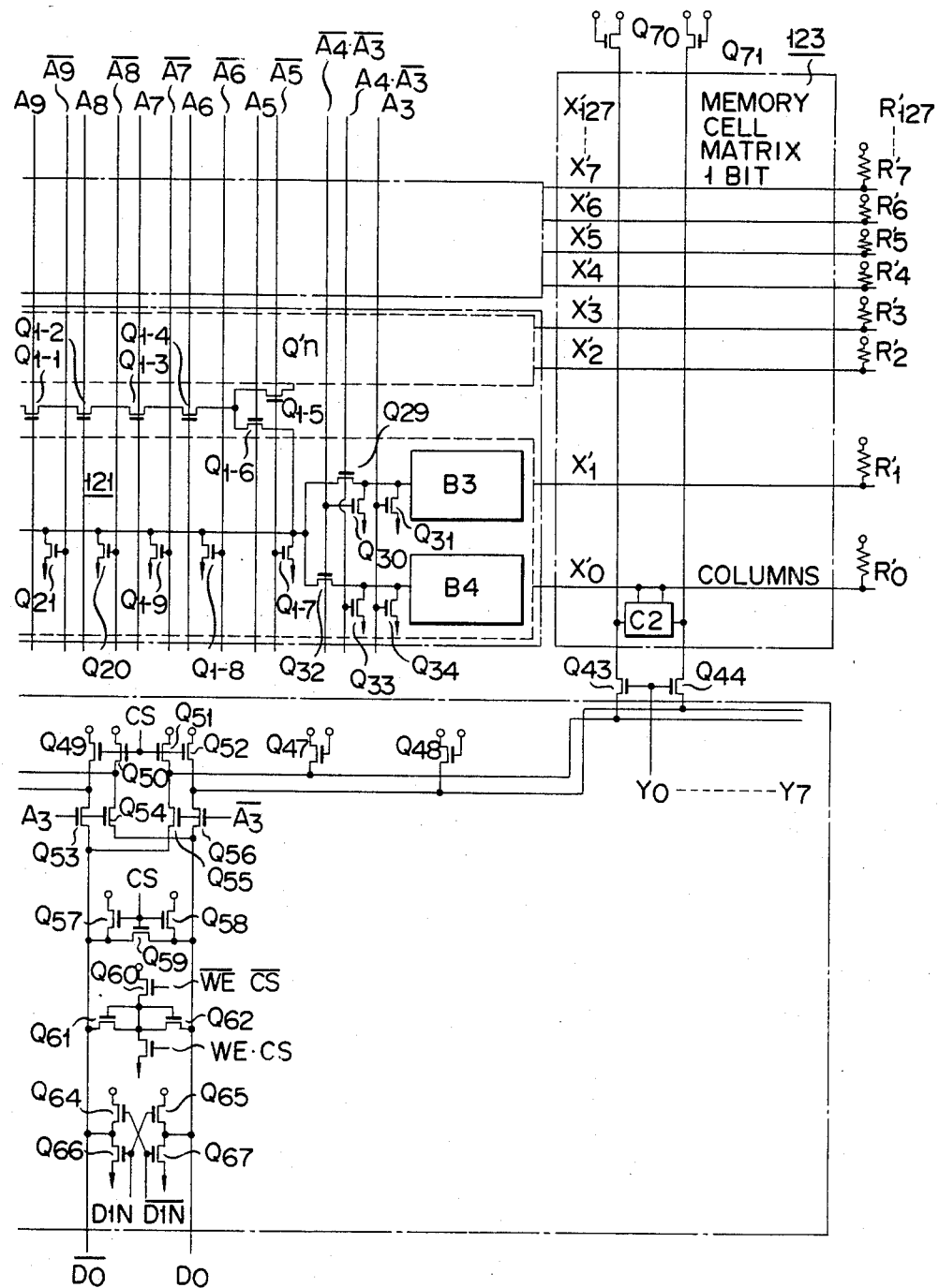

FIGS. 14A, 14B show circuits of the row decoder 121, the memory cell matrices 122, 123 and the I/O bus line 124. In FIGS. 14A, 14B, the row decoder 121 is divided into 32 row decoder circuits RD0-RD31. The row decoder circuit RD0 is connected to the word lines X0-X3 inside the first memory cell matrix 122 and the word lines X0'-X3' in the second memory cell matrix 123. Similarly, each set of four word lines X4-X127 and X4'-X127' is connected to a respective row decoder circuit RD1-RD31. The other ends of the word lines X0-X127 are connected to the power source terminals through the resistors R0-R127 while the other ends of the word lines X0'-X127' are connected to the power terminals through the resistors R0'-R127'.

Symbols Y0-Y7 denote the outputs of the column decoder 120, and the symbols A3-A10 and $\overline{A3}$-$\overline{A10}$ denote the outputs of the address buffers AB3-AB10. The address buffer output A10 is connected to the gate of a transistor Q1-0; the output A9, to the gate of a transistor Q1-1; A8, to the gate of Q1-2; A7, to the gate of Q1-3; A6, to the gate of Q1-4; $\overline{A5}$, to the gates of Q1-5, Q1-7; and A5, to the gate of Q1-6. The outputs $\overline{A6}$, $\overline{A7}$, $\overline{A8}$, $\overline{A9}$, and $\overline{A10}$ are respectively connected to the gates of transistors Q1-8, Q1-9, Q20, Q21, and Q22. The sources and the drains of the transistors Q1-0 through Q1-7 are respectively connected in series, and the transistor Q1-4 is connected to the transistors Q1-5 and Q1-6. The transistors Q1-8 through Q22 are connected to the transistor Q1-6. Transistors Q23, Q26, Q29, and Q32 are connected to the transistor Q1-6; transistors Q24, Q25, to the transistor Q23; transistors Q27, Q28, to the transistor Q26; transistors Q30, Q31, to the transistor Q29; and transistors Q33, Q34, to the transistor Q32.

The transistor Q23 is connected to the word line X1 through the buffer circuit B1 consisting of transistors Q35-Q40. The transistor Q26 is connected to the word line X0 through a buffer circuit B2 of similar construction. The transistors Q29, Q30 are respectively connected to the word lines X1', X0' through buffer circuits B3, B4 of similar construction. Circuits of similar construction to those connected to the word lines X0, X1, X0' and X1' are also disposed in the row decoder circuit RD0 for the word lines X2, X3, X2' and X3'. The other row decoder circuits RD1-RD31 are constructed in a similar manner. The transistors Q1-0 to Q1-3, and Q35 are of the depletion type (to be referred to as D type transistors hereinafter), the transistors Q1-4, Q37 are transistors whose threshold voltages are near zero (to be referred to as I type transistors), and the transistors Q1-5 through Q34, Q36, and Q38–Q40 are of the enhancement type (to be referred to as E type transistors hereinafter).

The word line X0 of the memory cell matrix 122 is connected to word terminals of a memory cell C1 and digit terminals of the memory cell C1 are connected to transistors Q41, Q42. The word line X0' of the memory cell matrix 123 is similarly connected to word terminals of a memory cell C2, and digit terminals of the memory cell C2 are connected to transistors Q43, Q44.

In the I/O bus line 124, the transistors Q41, Q42 are respectively connected to transistors Q45, Q46, and the transistors Q43, Q44 are connected to transistors Q47, Q48. The transistor Q41 is further connected to the transistors Q49, Q53. The transistor Q42 is connected to the transistors Q50, Q54. The transistor A43 is connected to the transistors Q51, Q55, and the transistor Q44 is connected to the transistors Q52, Q56. The gates of the transistors Q49, Q50, Q51, and Q52, are commonly connected so that chip select signal CS may be applied. An address signal A3 is supplied to the gates of the transistors Q53, Q54, and an address signal $\overline{A3}$ is supplied to the gates of the transistors Q55, Q56.

The operation of the circuit shown in FIGS. 13, and 14A, 14B will be described. The circuit consisting of the transistors Q1-0 through Q22 is a decoder of the NOR type, and an address signal of opposite phase from that of the driver side is supplied to the load side to save current. This decoder selects two word lines among the 128 row lines. E type transistors are used for the transistors Q1-5, Q1-6 at the load side. By supplying an address signal $\overline{A5}$ to the transistors Q1-5, Q1-7, and an address signal A5 to the transistors Q1-6, current does not flow through the decoders which are not selected by the address signal A5. By using an I type transistor for the transistor Q1-4, the speed is not reduced and current is saved. With the circuit consisting of the transistors Q23–Q34, one of the two lines is selected, either the right or the left, that is, selection between the memory cell matrices 122, 123 is performed. With signals A3·A4, $\overline{A3}$·A4, A3·$\overline{A4}$, $\overline{A3}$·$\overline{A4}$ and A3, $\overline{A3}$ produced from address signals A3, A4, one of the buffers B1–B4 is selected. The selected buffer drives one of the word lines X0–X127, X0'–X127', and the address selecting transistor of the next memory cell becomes conductive. Bootstrap circuits are used for the buffers B1–B4 and the load transistor Q39 of the output stage is of the E type, so that current does not flow when the output is at "0" level. An inverter consisting of the transistors Q37, Q38 is connected in parallel with the output stage inverter, and its output bootstraps the node of the gates of transistors Q37, Q39 through a capacitor C. Since the load capacity of the output of the inverter connected in parallel is extremely small, the bootstrapped speed is very fast and the transistor Q39 may be driven forcibly. By using an I type transistor for the transistor Q37, the gate width may be made smaller so that the parasitic capacity of the bootstrapping node is made smaller and the bootstrapping is facilitated. Cutting of the node for bootstrapping is performed by the transistors Q23, Q26, Q29, and Q32, and these transistors also function to switch over the right and left, upper and lower buffers B1–B4. Thus, the number of the node cutting may be reduced by four. Since the output of the buffers B1–B4, that is, the word lines X0, X1, X0' and X1' (similarly the word lines X2–X127, X2'–X127') is driven by an E type transistor, resistors R0–R127, R0'–R127' of high resistance polycrystalline silicon are used for keeping the power source level at "1" level.

By the row decoder 121, either of the memory cell matrices at the sides of the row decoder 121 is selected that is, one of the word lines X0–X127, X0'–X127' is selected. Among the memory cells connected to the selected word line, the data of the digit line selected by the outputs Y0–Y7 of the column decoder 120 is transferred to the I/O bus line 124. For example, when the output Y0 is selected, the data of the digit line connected to the transfer gate transistors Q41, Q42 is transferred, and the data of the digit line of the unselected word line is not transferred. In FIGS. 14A, 14B, the circuit consisting of the transistors Q45–Q67 is the I/O bus line 124. E type transistors are used for all of the transistors, except for the transistors Q53–Q56, and Q59, which are of the I type. The transistors Q45–Q48 are the load transistors, and the transistors Q49–Q52, Q57, and Q58 are load transistors for immediately keeping the input/output circuit level at "1" when the chip selection input terminal $\overline{CS}$ is at "1" level. When $\overline{CS}$ is at the "0" level, the gate level becomes "0", and the gate is cut off. The transistor Q59 is a transistor of short-circuiting the node when the $\overline{CS}$ terminal is at the "1" level. The transistors Q53–Q56 are transfer gates for selecting the data line at the side for obtaining the data of the memory cell selected by the row decoder 121 and the column decoder 120 from the left and the right memory cell matrices 122, 123. The address signal $\overline{A3}$ is supplied to the gates of the transistors Q53, Q54, and the address signal A3 is supplied to the transistors Q55, Q56 so that the word line selected by the row decoder may be selected. The circuit consisting of the transistors Q60–Q63, Q64–Q67 is a circuit for writing the information. The transistors Q64–Q67 constitute a writing circuit wherein inputs DIN, $\overline{DIN}$ are both at the "0" level during reading and are cut off, and the inputs DIN, $\overline{DIN}$ are transferred during writing to be written in the memory cell. The circuit consisting of the transistors Q60–A63 is a circuit for raising the level "0" of the data line to the original level when the writing is completed. This circuit has conventionally been included independently of the respective data lines. However, the transistors Q60, Q63 shown in FIGS. 14A, 14B each functions as two conventional transistors, and the data line is driven through the transistors Q61, Q62. The "1" level of the data line is always at the ($V_{CC}$-$V_{TH}$) level as the threshold voltage $V_{TH}$ of the power source voltage $V_{CC}$ during writing and reading, so that the transistor Q61 or Q62 selected to the "1" level side is always cut off. The side where the "0" level has dropped to substantially the ground level by the writing circuit alone is turned on, and the level returns to the original level when the writing is terminated.

The data passed through the transfer gates Q53–Q56 is supplied to the output buffers OB0–OB7 shown in FIG. 13, and the data is obtained at the input/output terminals IO-0–IO-7.

The detailed circuit construction of the address buffers AB3–AB5 among address buffers AB0–AB10 for driving the row decoder 121 will be described referring to FIGS. 15 and 16.

FIG. 15 shows the details of the address buffer AB5 shown in FIG. 13. Transistors Q100–Q102, transistor Q103–Q105, and transistors Q106–Q108 are respectively connected in series with each other. Further, transistors Q109–Q111 and transistors Q113–115 are respectively connected in series with each other. A transistor Q111 is connected in parallel with a transistor Q112, and transistor Q115 is connected in parallel with a transistor Q116. The gates of the transistors Q100, Q103, and Q106 are commonly connected and are supplied with the chip select signal CS; the address signal A5 is supplied to the gate of the transistor 102. The chip select signal CS is also supplied to the transistors Q109, Q113, and the signal $\overline{CS}$ is supplied to the gates of the transistors Q112, Q116. The internal address signal A5 is supplied from the juncture between the transistors Q110, Q111, and Q112 and the internal address signal $\overline{A5}$ is supplied from the juncture between the transistors Q114, Q115 and Q116.

The transistors Q100, Q103, Q106, Q109, and Q113 are of the I type; the transistors Q101, Q104, Q107, Q110 and Q114 are of the D type; and the transistors Q102, Q105, Q108, Q111, Q112, Q115, and Q116 are of the E type. The internal address signals A5, $\overline{A5}$ are produced from the address signal A5 from outside. When the input signal $\overline{CS}$ is at the level "1", both of the internal address signals A5, $\overline{A5}$ drop to the level "0". The internal address signals A5, $\overline{A5}$ enter the transistors Q1-5 through Q1-7 of the row decoder 121 of FIGS. 14A, 14B. When the level of the input signal $\overline{CS}$ is at "1", both of the signals A5, $\overline{A5}$ are at the "0" level so that all of the transistors Q1-5 through Q1-7 are cut off and the current of the row decoder is interrupted.

Figure 16:
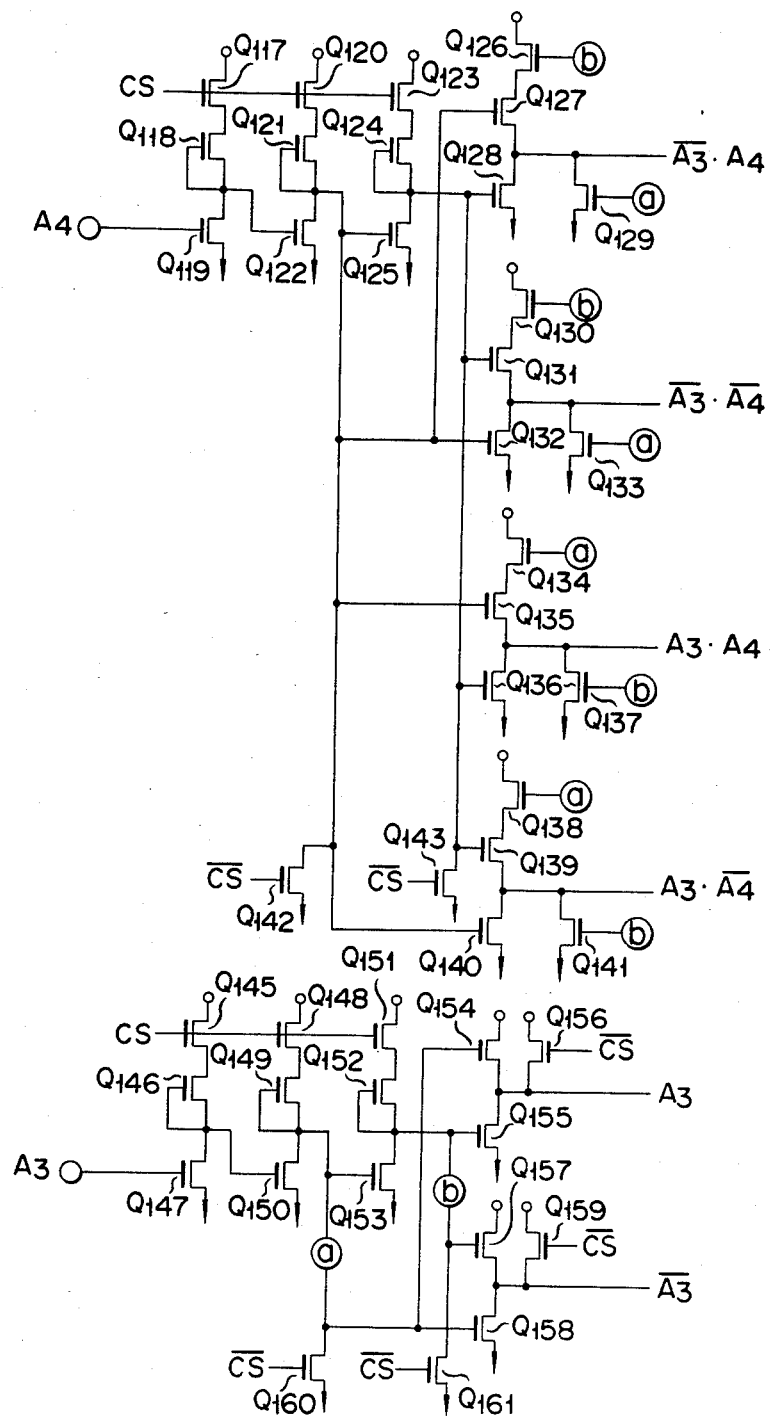

FIG. 16 shows the details of the address buffers AB3, AB4 and the gate circuits G1–G4 shown in FIG. 13. Transistors Q117, Q120, Q123, Q145, Q148 and Q151 are of the I type; transistors Q118, Q121, Q124, Q126, Q127, Q130, Q131, Q134, Q135, Q138, Q139, Q146, Q149, Q154, Q156, Q157 and Q159 are of the D type; and the rest are of the E type. The address signals A3, A4 from the outside produce internal address signals A3, $\overline{A3}$, A3·A4, A3·$\overline{A4}$, $\overline{A3}$·A4, and $\overline{A3}$·$\overline{A4}$. When the input signals $\overline{CS}$ is at the level "1", the current is reduced by the I type transistors. The signals A3, $\overline{A3}$ are both raised to the level "1" by the transistor Q156, Q159. With the internal address signals provided from the outside address signals A3, A4, the selection of right or left, upper to lower word lines is performed by the row decoder 121 shown in FIGS. 14A, 14B.

With the above circuit construction, the power consumption is greatly reduced. Consequently, the power consumption distribution shown in Table 2 is obtained. Thus, an S-RAM of 16k bits having 70 mA the total power consumption and 80 nsec access time is obtained.

TABLE 2

| Part name | Power consumption ratio (%) |
|---|---|
| Row, column address buffers | 21.8 |
| Row, column decoders | 10.9 |
| I/O bus line | 25.9 |
| Date input/output buffers | 33.7 |
| Control circuit | 7.7 |

The S-RAM with the characteristics shown in Table 2 above is of the circuit construction shown in FIGS. 13–16. The memory cells constituting the memory cell matrices 122, 123 may be of the construction shown in FIGS. 1–11, or the memory cells of the construction shown in FIGS. 17 and 18 may be used.

Figure 17:
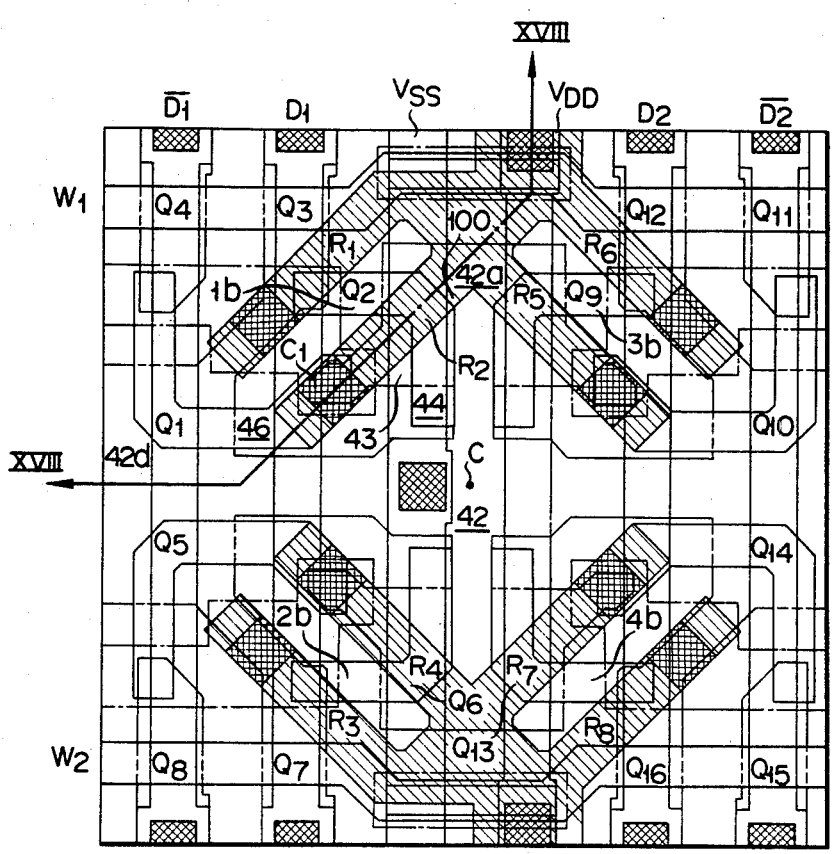
FIG. 17 is a plan view of another example of a memory cell.

The basic construction of the memory cell shown in FIG. 17 is the same as that of FIG. 9, and the same parts are designated by the same numerals. However, the pattern of the polycrystalline silicon layer used as the load resistors R1–R8 is not the one shown in FIG. 10, and the one inclined hatched and denoted by the numeral 100 in FIG. 17 may be used. The construction of the memory device shown in FIGS. 17 and 18 has been already explained in detail and may be easily followed by referring to the numerals, so that further description is omitted.

What we claim is:
1. A semiconductor device comprising:
a first semiconductor region and first to fourth memory cell-forming areas all formed on a semiconductor substrate of a first conductivity type,
said first semiconductor region having a second conductivity type opposite to said first conductivity type and including a center region and first to fourth extension regions which extend in four directions away from said center region, two in a row direction and two in a column direction, thereby dividing a major surface of said semiconductor substrate into said first to fourth memory cell-forming areas, each of said cell-forming areas including:
a second semiconductor region of the second conductivity type having one end formed proximate said first extension region which extends in said row direction, for forming a first driver transistor between said second semiconductor region and said first extension region;
a third semiconductor region of the second conductivity type formed proximate said second extension region which extends in the column direction, for forming a second driver transistor between said third semiconductor region and said second extension region;
a fourth semiconductor region of the second conductivity type formed close to the other end of said second semiconductor region, for forming a first switching transistor between said fourth semiconductor region and said second semiconductor region;
fifth and sixth semiconductor regions of the second conductivity type formed close to each other, for forming a second switching transistor therebetween;
a first polycrystalline silicon gate electrode formed between said first extension region and the one end of said second semiconductor region and being the gate electrode of said first driver transistor, one end of said first gate electrode extending in the column direction and being connected to said fifth semiconductor region, and the other end of said first gate electrode being connected to said third semiconductor region;
a second polycrystalline silicon gate electrode formed between said second extension region and said third semiconductor region and being the gate electrode of said second driver transistor, one end of said second gate electrode being connected to said second semiconductor region;
a polycrystalline silicon word line formed in the row direction on a gate insulation layer and being a common gate electrode of said first and second switching transistors;
a first resistance polycrystalline silicon layer formed above said second semiconductor region on an insulation layer therebetween, one end of said first resistance layer being in contact with said second semiconductor region and said second polycrystalline silicon gate electrode such that said first resistance layer is used as a load for said first driver transistor;

a second resistance polycrystalline silicon layer formed above said third semiconductor region on an insulation layer therebetween, one end of said second resistance layer being in contact with said third semiconductor region and said first polycrystalline silicone gate electrode such that said second resistance layer is used as a load for said second driver resistor;

a common resistance polycrystalline silicon layer formed above a free end of said second extension region for connecting said first and second resistance polycrystalline silicon layers at one end;

a metal ground line formed in the column direction on an insulation layer so as to extend above said center region for connecting with said first semiconductor region; and first and second metal data lines formed in the column direction and connected to said first and second switching transistors, respectively.

2. A semiconductor device according to claim 1 wherein said first and second resistance polycrystalline silicon layers each have a substantially uniform impurity concentration, except in portions in direct contact with one of said semiconductor regions.

3. A semiconductor device according to claim 1, wherein said first and second resistance polycrystalline silicon layers each include a low impurity concentration portion used as the load and a high impurity concentration portion continuously formed at the ends of the low impurity concentration portion.

* * * * *